United States Patent
Crowder et al.

(10) Patent No.: US 10,069,061 B2
(45) Date of Patent: Sep. 4, 2018

(54) FABRICATION AND HARVEST OF PIEZOELECTRIC PLATES

(71) Applicant: eLux Inc., Vancouver, WA (US)

(72) Inventors: Mark Albert Crowder, Portland, OR (US); Changqing Zhan, Vancouver, WA (US); Karen Nishimura, Washougal, WA (US); Paul Schuele, Washougal, WA (US)

(73) Assignee: eLux Inc., Vancouver, WA (US)

( * ) Notice: Subject to any disclaimer, the term of this patent is extended or adjusted under 35 U.S.C. 154(b) by 286 days.

(21) Appl. No.: 15/171,521

(22) Filed: Jun. 2, 2016

(65) Prior Publication Data

US 2017/0352799 A1 Dec. 7, 2017

(51) Int. Cl.
| | |
|---|---|
| *H01L 41/04* | (2006.01) |
| *H01L 41/047* | (2006.01) |
| *H01L 41/332* | (2013.01) |
| *H01L 41/314* | (2013.01) |
| *H01L 41/297* | (2013.01) |

(Continued)

(52) U.S. Cl.
CPC .......... *H01L 41/332* (2013.01); *H01L 41/297* (2013.01); *H01L 41/314* (2013.01); *H01L 41/1871* (2013.01); *H01L 41/1873* (2013.01); *H01L 41/1876* (2013.01); *H01L 41/193* (2013.01)

(58) Field of Classification Search
CPC .... H01L 41/297; H01L 41/314; H01L 41/332
USPC ................................ 310/363–365
See application file for complete search history.

(56) References Cited

U.S. PATENT DOCUMENTS

| | | | |
|---|---|---|---|
| 8,970,095 B2 * | 3/2015 | Nakamura | B81B 3/00 29/25.35 |
| 2008/0018199 A1 | 1/2008 | Troller-McKinstry et al. | |
| 2015/0368162 A1 * | 12/2015 | Hayashi | B41J 2/14233 252/62.9 PZ |

FOREIGN PATENT DOCUMENTS

| | | |
|---|---|---|
| JP | S62-14484 | 1/1987 |
| JP | 51-15239 | 9/2009 |
| JP | 2013-225546 | 10/2013 |

OTHER PUBLICATIONS

Omori et al., "Preparation of piezoelectric PZT micro-discs by sol-gel method", IEEJ Transactions on Sensors and Micromachines 121(9):496-500 • Dec. 2000.

(Continued)

*Primary Examiner* — Thomas Dougherty
(74) *Attorney, Agent, or Firm* — Law Office of Gerald Maliszewski; Gerald Maliszewski

(57) ABSTRACT

A method is provided for fabricating piezoelectric plates. A sacrificial layer is formed overlying a growth substrate. A template layer, with openings exposing sacrificial layer surfaces, is formed over the sacrificial layer. An adhesion layer/first electrode stack is selectively deposited in the openings overlying the sacrificial layer surfaces, and a piezoelectric material formed in the openings overlying the stack. Then, a second electrode is formed overlying the piezoelectric material. Using the second electrode as a hardmask, the piezoelectric material is etched to form polygon-shaped structures, such as disks, attached to the sacrificial layer surfaces. After removing the template layer and annealing, the polygon-shaped structures are separated from the sacrificial layer. With the proper choice of growth substrate material, the annealing can be performed at a relatively high temperature.

9 Claims, 4 Drawing Sheets

(51) Int. Cl.
 *H01L 41/187* (2006.01)
 *H01L 41/193* (2006.01)

(56) References Cited

OTHER PUBLICATIONS

Iijima et al., "Fabrication of Lead Zirconate Titanate Thick Film Disks for Micro Transducer Devices", MRS Proceedings, 785, D4.5 doi:10.1557/PROC-785-D4.5.

* cited by examiner

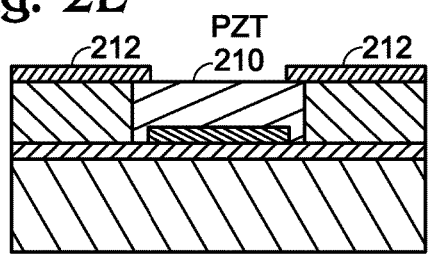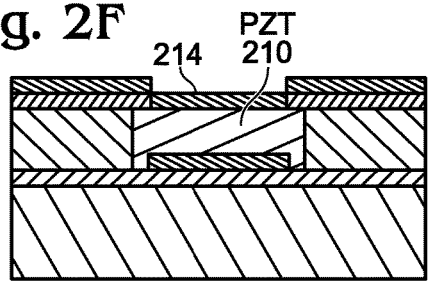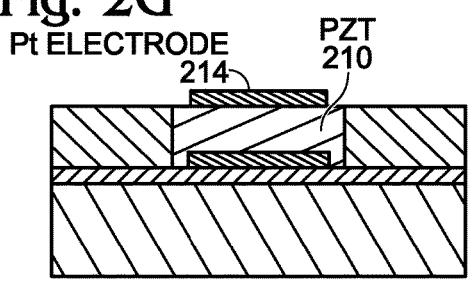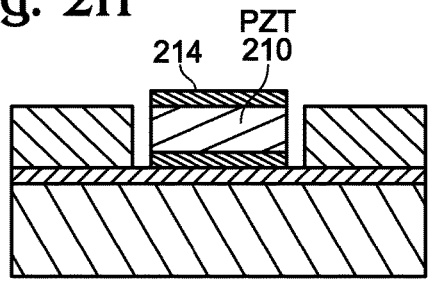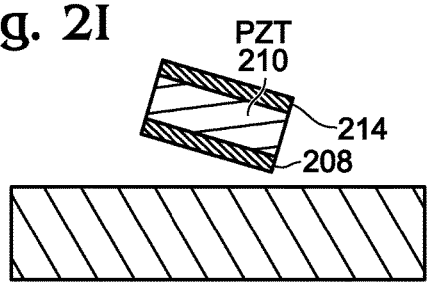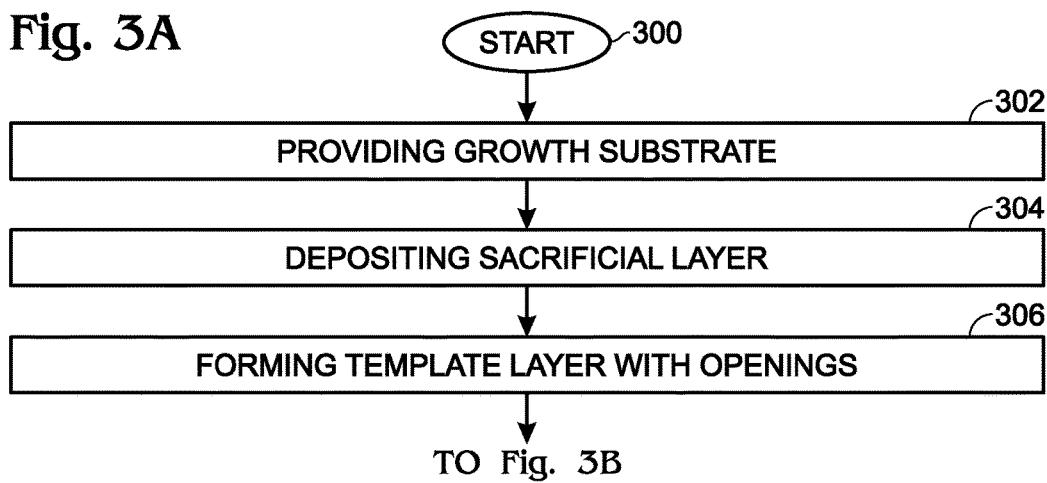

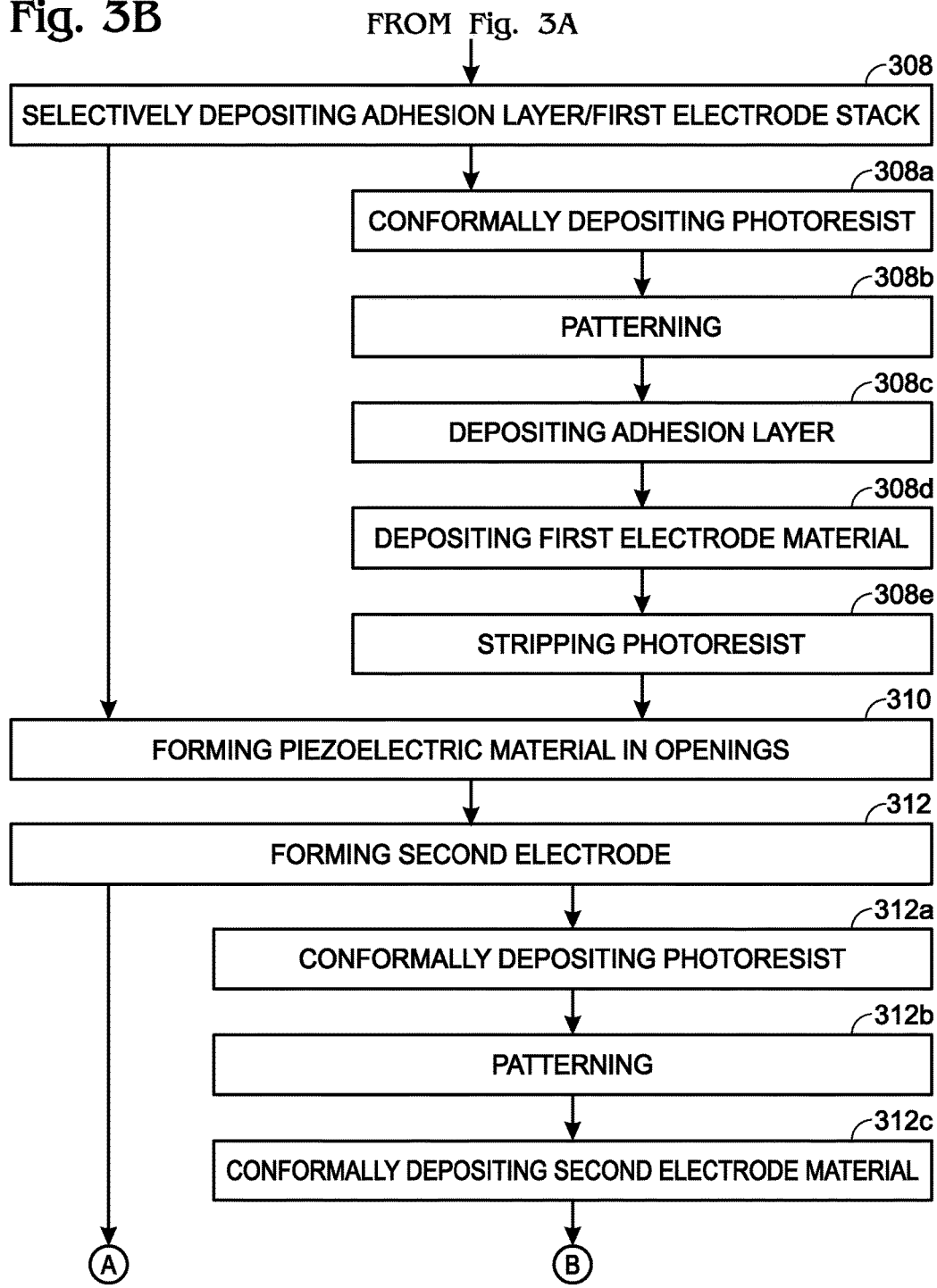

FABRICATION AND HARVEST OF PIEZOELECTRIC PLATES

BACKGROUND OF THE INVENTION

1. Field of the Invention

This invention generally relates to thin-film device fabrication and, more particularly, to the fabrication of piezoelectric structures requiring high temperature annealing.

2. Description of the Related Art

Ceramic piezoelectric materials such as lead zirconate titanate (PZT) or barium titanate (BaTiO$_3$) have a high piezoelectric coefficient that allows for their use in high-sensitivity ultrasonic sensors or energy harvesters. However, the formation of such materials typically requires high sintering temperatures that are incompatible with low-cost, high-temperature-intolerant substrates such as glasses or plastics.

Currently, this problem can be addressed using a polymer-based piezoelectric material, such as polyvinylidene fluoride (PVDF) or polyvinylidene fluoride co-polymer (P(VDF-TrFE), that can be spin-coated onto the receiving substrate. However, the piezoelectric coefficient of these polymer materials is typically 25 times lower than that for the ceramic piezoelectric materials, thereby limiting the sensitivity of the ultrasonic sensor array.

PZT disks can be formed on a growth substrate in a variety of ways, including the molding of a sol-gel PZT precursor or chemical solution deposition of sol-gel PZT. As shown in the literature, PZT disks can be formed with a thickness of 1 microns (μm) and a diameter of 80-200 μm. The latter was used to for larger, thicker disks with thicknesses of 10 μm and diameters of 100-500 μm. By forming the disks on a separate growth substrate, the sintering process can be carried out using optimized conditions for forming the PZT material (e.g., sintering at 650° C. for several hours). However, these disks are formed on a planar bottom electrode that is continuous between all the disks. There is a very limited use for such a structure. Further, there has been no means demonstrated for separating these disks from the growth substrate, forming the disks into individual electrical devices, or a particular use shown for individual disk electrical devices.

It would be advantageous if a process existed for fabricating high annealing temperature piezoelectric structures that was compatible with low cost thin-film sensor devices. It would be advantageous if these piezoelectric structures could be adapted for use with fluidic assembly processes.

SUMMARY OF THE INVENTION

Disclosed herein are a structure and method for fabricating disks formed from lead zirconate titanate (PZT) or other piezoelectric materials that ensures completion of all high-temperature processing of the piezoelectric ceramic prior to harvesting from a growth substrate. The piezoelectric disks can then be used in a variety of applications such as an ultrasonic sensor array for a touchscreen or imaging sensor, structural or personal health monitor, or a ferroelectric memory array.

PZT disks can be formed on a growth substrate in a variety of ways, including the molding of a sol-gel PZT precursor or chemical solution deposition of sol-gel PZT. By forming the disks on a separate growth substrate, the sintering process can be carried out using optimized conditions for forming the PZT material (e.g., sintering at 650° C. for several hours). The disks can be formed on the growth substrate with top and bottom metal electrodes for low contact resistance.

Accordingly, a method is provided for fabricating piezoelectric plates. The method provides a growth substrate. The growth substrate may be a material such as silicon, quartz, or sapphire. A sacrificial layer is formed overlying the growth substrate. A template layer, with openings exposing sacrificial layer surfaces, is formed over the sacrificial layer. An adhesion layer/first electrode stack is selectively deposited in the openings overlying the sacrificial layer surfaces, and a piezoelectric material formed in the openings overlying the stack. Then, a second electrode is formed overlying the piezoelectric material. Using the second electrode as a hardmask, the piezoelectric material is etched to form polygon-shaped structures, such as disks, attached to the sacrificial layer surfaces. After removing the template layer and annealing, the polygon-shaped structures are separated from the sacrificial layer. With the proper choice of growth substrate material, the annealing can be performed at a relatively high temperature. The template layer can be removing using a wet etch. The result is polygon-shaped piezoelectric plates, each plate sandwiched between a pair of planar electrodes.

Some examples of suitable piezoelectric material include lead zirconium titanate (PZT), barium titanate (BaTiO$_3$), polyvinylidene fluoride (PVDF), a polyvinylidene fluoride co-polymer (P(VDF-TrFE), quartz, zinc oxide (ZnO), aluminum nitride (AlN), and lanthanum-doped lead zirconium titanate (PZLT). The sacrificial layer may be tetraethyl orthosilicate (TEOS), thermal silicon dioxide (SiO$_2$), amorphous silicon (a-Si), or a piezoelectric material. The template layer may be titanium oxide (TiO$_2$), SiO$_2$, or silicon nitride (SiN), and the electrode material may be platinum (Pt), palladium (Pd), ruthenium oxide (RuO$_2$), or gold (Au).

Additional details of the above-described method and a fluidic assembly solution of piezoelectric plates are provided below.

BRIEF DESCRIPTION OF THE DRAWINGS

FIGS. 2A through 2I are a partial cross-sectional view of an exemplary piezoelectric plate fabrication method.

FIGS. 3A through 3C are a flowchart illustrating a method for fabricating piezoelectric plates.

DETAILED DESCRIPTION

Figure 1:
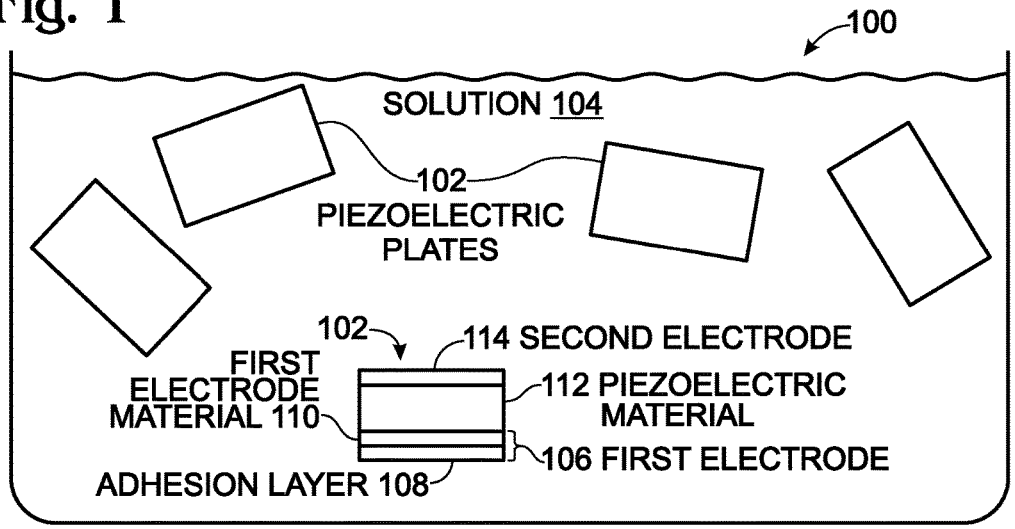
FIG. 1 is a partial cross-sectional view of a fluidic assembly solution of piezoelectric plates.

FIG. 1 is a partial cross-sectional view of a fluidic assembly solution 100 of piezoelectric plates. A plurality of piezoelectric plates 102 are suspended in a solution 104. Each plate 102 comprises a planar first electrode 106 having an adhesion layer 108/first electrode material 110 stack. A piezoelectric material 112 overlies the first electrode material 110, and a planar second electrode 114 overlies the piezoelectric material. For clarity, only one piezoelectric plate is shown in detail. Note: the second electrode is not necessarily a "top" electrode, as the plates are not aligned in any particular manner when in solution.

The piezoelectric material 112 may be one of the following: lead zirconium titanate (PZT), barium titanate (BaTiO$_3$), polyvinylidene fluoride (PVDF), polyvinylidene fluoride co-polymers (P(VDF-TrFE), quartz, zinc oxide (ZnO), aluminum nitride (AlN), or lanthanum-doped lead zirconium titanate (PZLT). However, the piezoelectric plates are not limited to any particular type of piezoelectric material. The first electrode material 110 may be platinum (Pt), palladium (Pd), ruthenium oxide ($RuO_2$), or gold (Au). The second electrode material 114 may also be Pt, Pd, $RuO_2$, or Au. The first and second electrode materials need not be the same. The adhesion layer 108 is a material such as (Ti), nickel (Ni), or chromium (Cr).

In one aspect, the piezoelectric plates are in the shape of a disk—circular with planar "top" and "bottom" surfaces. However, other polygon shapes are also useful. It is believed that these structures can only reasonably be obtained, in a low-cost high-volume process, using the fabrication process described below.

Figure 2A:
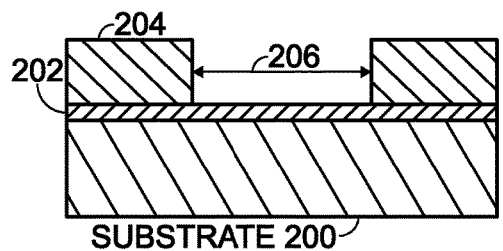

FIGS. 2A through 2I are a partial cross-sectional view of an exemplary piezoelectric plate fabrication method. In this example, PZT is used as the piezoelectric material. In FIG. 2A a growth substrate 200 (e.g., Si) is coated with an etchable sacrificial layer 202 such as TEOS or thermal $SiO_2$. In this example the template layer 204 is titanium oxide ($TiO_2$), which is deposited and patterned to form a mold for formation of the PZT disks. This pattern determines the diameter 206 of the PZT disks. Other materials can be used for the substrate, such as quartz or sapphire, so long as they can withstand high sinter annealing temperatures. In the case of PZT, the annealing temperature may be in excess of 650° C. In the case of a very high annealing temperature, a different sacrificial material such as amorphous silicon (a-Si) might be used. Other materials can also be used for the template layer, such as $SiO_2$ or SiN. The main requirement for the template layer 204 is that it have a high thermal stability for piezoelectric materials requiring a pre-sinter anneal. In the case of PZT for example, a pre-sinter anneal of 450° C. is useful.

Figure 2B:
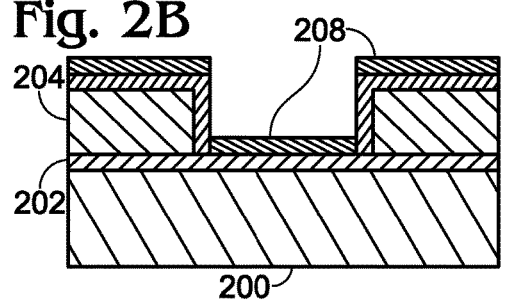

In FIG. 2B a negative-tone photoresist 206 is coated over the $TiO_2$ mold 204, and a Ti/Pt stack 208 is sputter-deposited. The Ti acts as an adhesion layer for the Pt on top of the sacrificial layer 202.

Figure 2C:
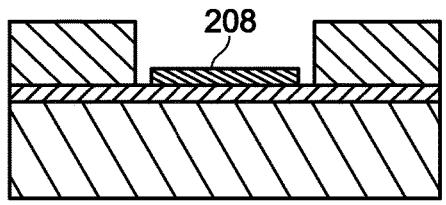
Figure 2D:
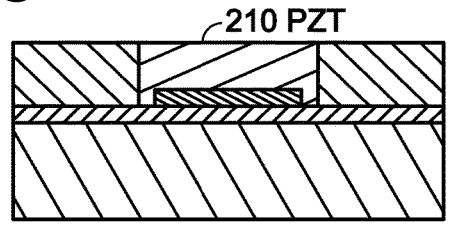

In FIG. 2C, after the lift-off resist is stripped, the bottom Ti/Pt stack 208 remains in the bottom of the well. Sol-gel PZT 210 is coated onto the substrate 200 such that it fills the $TiO_2$ molds, and is subsequently removed from the top surface of the $TiO_2$ template layer (FIG. 2D). Sol-gel is a process that produces solid materials from small molecules, involving the conversion of monomers into a colloidal solution (sol) that acts as the precursor for an integrated network (or gel) of either discrete particles or network polymers. Negative-tone photoresist 212 is again applied (FIG. 2E), and Pt 214 is sputtered onto the top of the PZT material 210 (FIG. 2F). After a photoresist lift-off process, the top Pt electrode 214 is left on the top of the PZT 210 (FIG. 2G).

The top Pt electrode 214 is used as a hard mask for etching the PZT 210 to form a self-aligned disk. The disks are pre-annealed at 450° C. prior to removal of the TiO2 template layer (FIG. 2H). After the template layer is removed, using a wet etch, the disks are sintered at 650° C., and then poled to maximize the piezoelectric coefficient. The sacrificial oxide layer is subsequently etched using a vapor HF. After removal of the sacrificial layer, the disks are harvested and captured in a suspension for fluidic assembly (FIG. 2I).

The piezoelectric disks can be harvested from the growth substrate by several methods, including laser lift-off (LLO) with an excimer laser (e.g., 308 nm wavelength XeCl) of directly-deposited PZT, undercutting of a Si sacrificial layer with XeF2, or undercutting of an oxide sacrificial layer with vapor HF. Note: the template is not affected by LLO process. A similar process can be used for other sol-gel-derived piezoelectric ceramics, such as BaTiO3. Further, the process is generally applicable to other piezoelectric elements such as PVDF, P(VDF-TrFE), $BaTiO_3$, quartz, $AlPO_4$, ZnO, AlN, or PZLT.

Figure 3C:
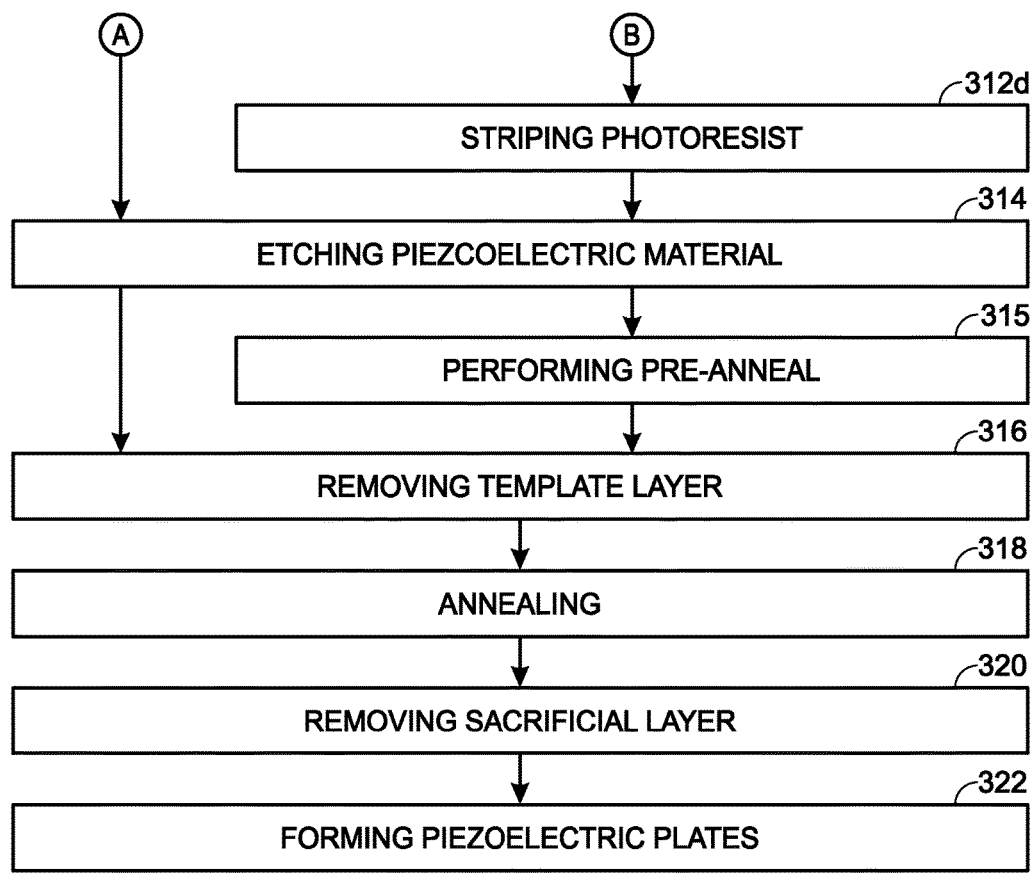

FIGS. 3A through 3C are a flowchart illustrating a method for fabricating piezoelectric plates. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 300.

Step 302 provides a growth substrate made from a material such as silicon, quartz, or sapphire. Step 304 deposits a sacrificial layer overlying the growth substrate. Some examples of sacrificial layer materials include TEOS, thermal silicon dioxide, amorphous silicon, or a piezoelectric material. As noted above, the choice of sacrificial material may be guided by the annealing temperatures to be used. Step 306 forms a template layer with openings exposing sacrificial layer surfaces. Some examples of template layer materials include titanium oxide, $SiO_2$, and silicon nitride. Step 308 selectively deposits an adhesion layer/first electrode stack in the openings overlying the sacrificial layer surfaces. Some examples of the first electrode material include platinum, palladium, ruthenium oxide, and gold. The adhesion layer may be titanium, nickel, or chromium.

Step 310 forms a piezoelectric material in the openings overlying the stack. Some examples of piezoelectric material include PZT, barium titanate ($BaTiO_3$), polyvinylidene fluoride (PVDF), a polyvinylidene fluoride co-polymer (P(VDF-TrFE), quartz, zinc oxide (ZnO), aluminum nitride (AlN), and lanthanum-doped lead zirconium titanate (PZLT). Some piezoelectric materials may be deposited as a sol-gel that fills the openings in the template layer. Step 312 forms a second electrode overlying the piezoelectric material, from a material such Pt, Pd, $RuO_2$, or Au. Using the second electrode as a hardmask, Step 314 etches the piezoelectric material to form polygon-shaped structures attached to the sacrificial layer surfaces. As used herein, polygon-shaped is defined to include circular and disk shapes. Step 316 removes the template layer and an annealing is performed in Step 318 at a first temperature. The template layer is removed in Step 316 using a wet etch process. As a result of the annealing in Step 318, the piezoelectric material is poled. That is, the voltage that it is possible to create between the electrodes as a result of applying a physical force, such as pressure or acceleration, is increased as a result of the annealing, which polarizes the piezoelectric particles in the same direction. In Step 320 the polygon-shaped structures are removed from the sacrificial layer. In Step 322 polygon-shaped piezoelectric plates are formed as a product. Each plate is sandwiched between a pair of planar electrodes.

In one aspect, forming the template layer with openings in Step 306 includes forming the template layer with circular openings. Then, etching the piezoelectric material to form polygon-shaped structures in Step 314 includes etching the piezoelectric material to form disks.

In another aspect, Step 308 selectively deposits the adhesion layer/first electrode stack in the openings overlying the sacrificial layer surfaces through substeps. Step 308a conformally deposits a photoresist layer overlying the template layer and exposed sacrificial layer surfaces. Step 308b patterns the photoresist layer to expose the sacrificial layer material surfaces. Step 308c sputter deposits the adhesion layer and Step 308d sputter deposits the first electrode material. Step 308e strips (lifts) off the photoresist to remove adhesion layer and first electrode material overlying the template layer.

In one aspect, forming the second electrode overlying the piezoelectric material in Step 312 includes substeps. Step 312a conformally deposits a photoresist layer overlying the template layer material and piezoelectric material in the template layer openings. Step 312b patterns the photoresist layer to expose the piezoelectric material. Step 312c conformally deposits the second electrode material, and Step 312d strips off the photoresist to remove the second electrode material overlying the template layer.

In one aspect, subsequent to etching the piezoelectric material to form polygon-shaped structures in Step 314, Step 315 performs an initial annealing at a second temperature, less than the first temperature. For example, if the piezoelectric material is PZT, the initial annealing at the second temperature may be performed at a temperature of greater than 450° C., and the annealing at the first temperature in Step 318 is performed at a temperature of greater than 650° C.

A piezoelectric structure and associated fabrication process have been provided. Examples of particular materials and process steps have been presented to illustrate the invention. However, the invention is not limited to merely these examples. Other variations and embodiments of the invention will occur to those skilled in the art.

We claim:

1. A fluidic assembly solution of piezoelectric plates comprising:
   a solution;
   a plurality of piezoelectric plates suspended in the solution, each plate comprising:
   a planar first electrode comprising an adhesion layer/first electrode material stack;
   a piezoelectric material overlying the first electrode material; and,
   a planar second electrode overlying the piezoelectric material.

2. The fluidic assembly solution of claim 1 wherein the piezoelectric material is selected from a group consisting of lead zirconium titanate (PZT), barium titanate (BaTiO$_3$), polyvinylidene fluoride (PVDF), polyvinylidene fluoride co-polymers (P(VDF-TrFE), quartz, zinc oxide (ZnO), aluminum nitride (AlN), or lanthanum-doped lead zirconium titanate (PZLT).

3. The fluidic assembly solution of claim 1 wherein the first electrode material is selected from a group consisting of platinum (Pt), palladium (Pd), ruthenium oxide (RuO$_2$), or gold (Au); and,
   wherein the second electrode material is selected from a group consisting of Pt, Pd, RuO$_2$, or Au.

4. The fluidic assembly solution of claim 1 wherein the adhesion layer is a material selected from a group consisting of titanium (Ti), nickel (Ni), or chromium (Cr).

5. The fluidic assembly solution of claim 1 wherein the piezoelectric plates have a polygon shape.

6. The fluidic assembly solution of claim 1 wherein the piezoelectric plates have a disk shape.

7. The fluidic assembly solution of claim 1 wherein particles in the piezoelectric material are polarized in the same direction.

8. The fluidic assembly solution of claim 1 wherein the piezoelectric plates are annealed piezoelectric plates, annealed at a temperature of greater than 650° C.

9. The fluidic assembly solution of claim 1 wherein the piezoelectric plates are twice-annealed piezoelectric plates, initially annealed at a temperature of greater than 450° C., and subsequently annealed at a temperature of greater than 650° C.

* * * * *